United States Patent
Kim

(10) Patent No.: US 7,379,367 B2
(45) Date of Patent: May 27, 2008

(54) MEMORY CONTROLLER AND SEMICONDUCTOR COMPRISING THE SAME

(75) Inventor: Kyoung-Park Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 29 days.

(21) Appl. No.: 10/834,757

(22) Filed: Apr. 29, 2004

(65) Prior Publication Data

US 2005/0024969 A1   Feb. 3, 2005

(30) Foreign Application Priority Data

Jul. 30, 2003   (KR)   ...................... 10-2003-0052619

(51) Int. Cl.
*G11C 7/00*   (2006.01)
*G11C 8/00*   (2006.01)
(52) U.S. Cl. .............. 365/222; 365/230.06; 365/230.08
(58) Field of Classification Search ............... 365/222, 365/230.03, 230.06, 233, 230.08
See application file for complete search history.

(56) References Cited

U.S. PATENT DOCUMENTS

| 5,627,791 A | * | 5/1997 | Wright et al. ............... 365/222 |
| 5,999,472 A | * | 12/1999 | Sakurai ...................... 365/222 |
| 6,262,931 B1 | * | 7/2001 | Kono et al. ............ 365/230.03 |
| 6,285,616 B1 | * | 9/2001 | Ikabata ...................... 365/222 |
| 6,381,188 B1 | * | 4/2002 | Choi et al. .................. 365/222 |
| 6,426,909 B1 | * | 7/2002 | Tomita ....................... 365/222 |
| 7,013,363 B2 | * | 3/2006 | Janzen ....................... 365/222 |

FOREIGN PATENT DOCUMENTS

| KR | P1999-0082643 | 11/1999 |
| KR | 1020000052491 | 8/2000 |

* cited by examiner

*Primary Examiner*—Trong Phan
(74) *Attorney, Agent, or Firm*—F. Chau & Assoc., LLC

(57) ABSTRACT

A memory controller and a semiconductor device comprising the same are provided. The semiconductor device comprises a memory block comprising a plurality of memory banks and a memory controller. The memory controller outputs an auto refresh command and memory bank information indicating a memory bank that is to be auto refreshed in an auto refresh mode. Thus, only the selected memory bank performs an auto refresh operation in the auto refresh mode while reducing current consumption in the semiconductor device.

10 Claims, 1 Drawing Sheet

MEMORY CONTROLLER AND SEMICONDUCTOR COMPRISING THE SAME

CROSS-REFERENCE TO RELATED APPLICATIONS

This application claims priority of Korean Patent Application No. 2003-52619, filed on Jul. 30, 2003, in the Korean Intellectual Property Office, the disclosure of which is incorporated herein by reference.

BACKGROUND OF THE INVENTION

1. Technical Field

The present invention relates to a semiconductor device, and more particularly, to a memory controller capable of outputting an auto refresh command and bank information in an auto refresh mode and a semiconductor device comprising the same.

2. Discussion of the Related Art

As wireless applications are developed for portable devices, there is a need for processing large amounts of data in such devices. This results in an increased use of dynamic random access memory (DRAM) memory cells in portable devices.

In order to preserve data in a DRAM, a refresh operation is performed in a memory cell of the DRAM. Refresh operations, however, consume excess current and drain battery power in portable devices employing DRAMs. Thus, the DRAM memory cells are not commonly used in portable devices that use batteries such as mobile phones, personal digital assistants (PDAs), etc.

Methods for reducing the amount of current consumed during refresh operations have been studied in order to increase the lifetime of batteries in portable devices. However, when refresh operations employing such methods are performed in semiconductor devices having memory banks and/or cells, currents are unnecessarily consumed because each memory cell in the semiconductor device conducts the refresh operations.

SUMMARY OF THE INVENTION

According to an aspect of the present invention, a memory controller for controlling a plurality of memory banks, comprises: an address generator for generating memory bank information to select a memory bank from the plurality of memory banks; a storage circuit for receiving and storing the memory bank information; and a refresh controller for outputting a refresh command and the memory bank information stored in the storage circuit in an auto refresh mode.

According to another aspect of the present invention, a semiconductor device comprises: a memory block comprising a plurality of memory banks; and a memory controller for outputting a refresh command and memory bank information to select a memory bank from the plurality of memory banks in a refresh mode. The memory bank selected by the memory bank information conducts a refresh operation in response to the refresh command. The memory block further comprises a decoder to select the memory bank after receiving and decoding the memory bank information. The memory controller further comprises: an address generator for generating memory bank information to select a memory bank from the plurality of memory banks; a storage circuit for receiving and storing the memory bank information; and a refresh controller for outputting a refresh command and the memory bank information stored in the storage circuit in the auto refresh mode, wherein the bank information is a n bit address, where n is a natural number.

According to yet another aspect of the present invention, a method for performing an auto refresh operation in a selected memory bank of a semiconductor device, comprises: generating memory bank information to select a memory bank from a plurality of memory banks; storing the memory bank information; outputting an auto refresh command and the memory bank information to the selected memory bank for performing the auto refresh operation; and performing the auto refresh operation in the selected memory bank. The auto refresh command and the memory bank information are output when a semiconductor device is in an auto refresh mode.

The generating step comprises: receiving an m bit address, where m is a natural number; converting the m bit address into an n bit address, where n is a natural number; and outputting the n bit address. The m bit address is output by a bus master. The method for performing an auto refresh operation in a selected memory bank of a semiconductor device further comprises decoding the memory bank information, wherein the auto refresh operation is performed in the selected memory block in response to the auto refresh command and the decoded memory bank information.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

Figure 1:
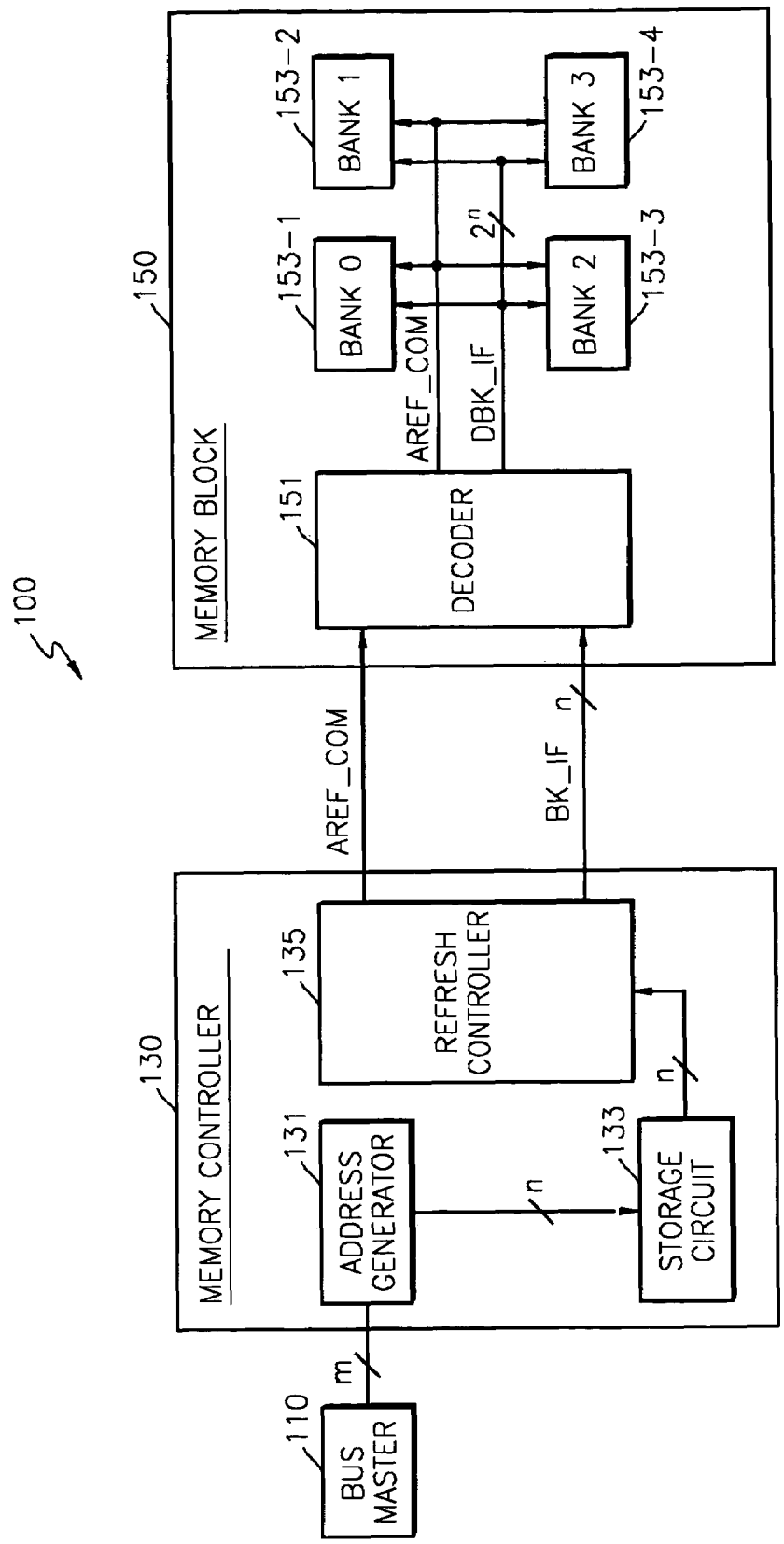
FIG. 1 a block diagram of a semiconductor device according to an exemplary embodiment of the present invention.

FIG. 1 is a block diagram of a semiconductor device according to an exemplary embodiment of the present invention. Referring to FIG. 1, a semiconductor device 100 includes a bus master 110, a memory controller 130, and a memory block 150. It is to be understood that the semiconductor device 100 is a portable and/or wireless device that uses a battery such as a mobile phone, personal digital assistant (PDA), etc.

The bus master 110 outputs an m bit address (m is a natural number) to the memory controller 130 in order to access a memory bank from a plurality of memory banks 153-1, 153-2, 153-3, and 153-4 in the memory block 150. The memory controller 130 controls the operation of the memory block 150 and includes an address generator 131, a storage circuit 133, and a refresh controller 135.

The address generator 131 receives the m bit address that is output from the bus master 110, converts the m bit address into an n bit address (n is a natural number) that is suitable for a predetermined telecommunication protocol, and outputs the n bit address to the storage circuit 133. The storage circuit 133, which includes a plurality of registers, stores the n bit address. In particular, the storage circuit 133 stores an address of at least one memory bank (hereinafter referred to as "bank information") that the bus master 110 accesses. The bank information BK_IF indicates the memory bank that will be auto refreshed.

The refresh controller 135 outputs an auto refresh command AREF_COM and the bank information BK_IF to the memory block 150 when the semiconductor device 100 conducts an auto refresh operation in an "auto refresh operation mode".

The memory block 150 includes a decoder 151 and the plurality of memory banks 153-1, 153-2, 153-3, and 153-4. The plurality of memory banks 153-1, 153-2, 153-3, and 153-4 include dynamic random access memory (DRAM) cells. The decoder 151 receives and decodes the auto refresh command AREF_COM and the bank information BK_IF that is output from the refresh controller 135, and selects at least one memory bank from the plurality of memory banks 153-1, 153-2, 153-3, and 153-4 to conduct the auto refresh operation. At least one of the selected memory banks conducts the auto refresh operation in response to the auto refresh command AREF_COM in the auto refresh operation mode.

The memory block 150 in FIG. 1 includes four memory banks 153-1, 153-2, 153-3, and 153-4. It is to be understood that in an alternative embodiment the memory block 150 can include more than four memory banks. The bank information BK_IF is formed of a four-bit address (A3,A2,A1,A0) shown in Table 1. It should also be understood that the bank information BK_IF could be expressed as a data packet. Table 1 also illustrates an Operation to be performed when the bank information BK_IF is input to the memory block 150. It is to be understood that the bank information BK_IF addresses listed in Table 1 and their associated Operations can modified to identify additional memory bank accesses. In addition, the bank information BK_IF addresses can include additional bits, for example, eight-bits.

TABLE 1

| A3 | A2 | A1 | A0 | Operation |
|---|---|---|---|---|
| 1 | 1 | 1 | 1 | Banks 0-3, are accessed. |
| 0 | 1 | 1 | 1 | Banks 0-2 are accessed. |
| 1 | 0 | 1 | 1 | Bank 0, Bank 1, and Bank 3 are accessed. |
| 1 | 1 | 0 | 1 | Bank 0, Bank 2, and Bank 3 are accessed. |
| 1 | 1 | 1 | 0 | Bank 1, Bank 2, and Bank 3 are accessed. |
| 0 | 0 | 1 | 1 | Bank 0 and Bank 1 are accessed. |
| 1 | 0 | 0 | 1 | Bank 0 and Bank 3 are accessed. |
| 0 | 1 | 0 | 1 | Bank 0 and Bank 2 are accessed. |
| 0 | 1 | 1 | 0 | Bank 1 and Bank 2 are accessed. |
| 1 | 0 | 1 | 0 | Bank 1 and Bank 3 are accessed. |
| 1 | 1 | 0 | 0 | Bank 2 and Bank 3 are accessed. |
| 0 | 0 | 0 | 1 | Only Bank 0 is accessed. |
| 0 | 0 | 1 | 0 | Only Bank 1 is accessed. |
| 0 | 1 | 0 | 0 | Only Bank 2 is accessed. |
| 1 | 0 | 0 | 0 | Only Bank 3 is accessed. |
| 0 | 0 | 0 | 0 | No Bank is accessed. |

An exemplary operation of the semiconductor device 100 will be now explained with reference to FIG. 1 and Table 1. When the bus master 100 accesses bank 0 (i.e., 153-1) and bank 1 (i.e., 153-2) in a normal mode, the bus master 110 outputs an m bit address to the memory controller 130 in order to access bank 0 and bank 1. It is to be understood that the m bit address associated with accessing banks 0 and 1 is identified as (0011) in Table 1.

The address generator 131 receives the m bit address, converts the m bit address to n bit bank information that is suitable for a protocol of the memory controller 130, and outputs the n bit bank information as BK_IF. The storage circuit 133 receives and stores the n bit bank information BK_IF. Thus, the storage circuit 133 stores the address (0011) as the bank information BK_IF. When the semiconductor device 100 enters into the auto refresh operation mode, the refresh controller 135 outputs the auto refresh command AREF_COM and the bank information BK_IF (0011) stored in the storage circuit 133 to the memory block 150. The decoder 151 decodes the auto refresh command AREF_COM and the bank information BK_IF (0011). Banks 0 and 1 conduct the auto refresh operation in response to the auto refresh command AREF_COM and decoded bank information DBK_IF output from the decoder 151.

In another example, if the bus master 110 accesses bank 3 (i.e., 153-4) in the normal mode, the refresh controller 135 outputs the bank information BK_IF, which includes its corresponding address (1000) as identified in Table 1, and the auto refresh command AREF_COM to the memory block 150 so as to refresh only bank 3. Therefore, bank 3 conducts the auto refresh operation in response to signals output from the decoder 151, i.e., AREF_COM and DBK_IF.

In yet another example, if the bus master 110 accesses bank 1, bank 2 (i.e., 153-3) and bank 3 in the normal mode, the refresh controller 135 outputs the bank information BK_IF, which includes its corresponding address (1110) as identified in Table 1, and the auto refresh command AREF_COM so as to refresh bank 1, bank 2 and bank 3 to the memory block 150. Thus, bank 1, bank 2 and bank 3 conduct the auto refresh operation in response to the signals AREF_COM and DBK_IF output from the decoder 151.

As described above, the memory controller 130 can simultaneously output the auto refresh command AREF_COM and bank information BK_IF in order to refresh at least one memory bank among the plurality of memory banks 153-1, 153-2, 153-3, and 153-4 in the auto refresh operation mode. Accordingly, the memory controller 130 and the semiconductor device 100 having the plurality of memory banks 153-1, 153-2, 153-3, and 153-4, conduct the auto refresh operation only in the memory bank accessed by the bus master 110 when replying to the bank information in the auto refresh operation mode. Therefore, unnecessary current consumption is reduced.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A memory controller for controlling a refreshing of a plurality of memory banks, the memory controller comprising:

an address generator that receives an m-bit address in a normal operation mode, and which generates n-bit memory bank information that is suitable for a predetermined telecommunication protocol from the received m-bit address, wherein the n-bit memory bank information identifies one or more memory banks;

a storage circuit that stores the n-bit memory bank information output from the address generator; and a refresh controller that generates an auto refresh command signal in an auto refresh operation mode and which outputs the auto refresh command signal together with the stored memory bank information from the storage circuit to perform a selective auto refresh operation in only the memory banks identified in the n-bit memory bank information, wherein memory banks not identified in the memory bank information are not refreshed.

2. The memory controller of claim 1, wherein the address generator receives the m-bit address from a bus master.

3. A semiconductor device comprising:
a memory block comprising a plurality of memory banks; and
a memory controller including:
an address generator that receives an address in a normal operation mode, and which generates memory bank information that is suitable for a predetermined telecommunication protocol from the received address, wherein the memory bank information identifies one or more memory banks;
a storage circuit that stores the memory bank information generated by the address generator; and
a refresh controller that generates an auto refresh command signal in an auto refresh operation mode and which outputs the auto refresh command signal together with the stored memory bank information from the storage circuit to perform a selective auto refresh operation in only the memory banks identified in the memory bank information,
wherein memory banks not indicated in the memory bank information are not refreshed.

4. The semiconductor device of claim 3, wherein the memory block further comprises:
a decoder that decodes the auto refresh command signal and memory bank information output from the refresh controller, and which outputs a decoded signal to conduct the auto refresh operation in the one or more selected memory banks.

5. The semiconductor device of claim 3, wherein the memory bank information is an n bit address, where n is a natural number.

6. A method for performing an auto refresh operation in memory banks of a semiconductor device, the method comprising:
inputting an address to a memory controller in a normal operation mode to access one or more memory banks of a memory block;
generating memory bank information from the received address, wherein the memory bank information is suitable for a predetermined telecommunication protocol and identifies one or more of the accessed memory banks;
storing the generated memory bank information;
generating an auto refresh command signal in an auto refesh operation mode of the semiconductor device;
outputting the auto refresh command signal together with the stored memory bank information to perform a selective auto refresh operation in the identified memory banks; and
refreshing only the identified memory banks and preventing memory banks not identified in the memory bank information from being refreshed.

7. The method of claim 6, wherein the address is an m bit address, where m is a natural number, the method further comprising:
converting the m bit address into the memory bank information which is an n bit address, where n is a natural number; and
outputting the n bit address.

8. The method of claim 7, wherein the m bit address is output by a bus master.

9. The method of claim 6, further comprising:
decoding the memory bank information.

10. The method of claim 9, further comprising:
performing the selective auto refresh operation in the identified memory banks in response to the auto refresh command signal and the decoded memory bank information.

* * * * *